(12) United States Patent
Luna et al.

(10) Patent No.: US 6,563,442 B1
(45) Date of Patent: May 13, 2003

(54) MULTIPLE SYMBOL LENGTH LOOKUP TABLE

(75) Inventors: Amelia Carino Luna, San Jose, CA (US); Jason (Naxin) Wang, San Jose, CA (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 10/242,089

(22) Filed: Sep. 11, 2002

Related U.S. Application Data

(63) Continuation of application No. 09/707,414, filed on Nov. 6, 2000.
(60) Provisional application No. 60/176,256, filed on Jan. 15, 2000.

(51) Int. Cl.[7] .............................. H03M 7/00; H03M 7/40
(52) U.S. Cl. ............................. 341/106; 341/50; 341/67
(58) Field of Search ................................ 341/106, 107, 341/50, 67, 65

(56) References Cited

U.S. PATENT DOCUMENTS

| | | | |
|---|---|---|---|
| 5,623,262 A | 4/1997 | Normile et al. | 341/67 |
| 5,625,355 A | 4/1997 | Takeno et al. | 341/67 |
| 5,982,306 A | 11/1999 | Nam | 341/67 |
| 6,215,424 B1 | 4/2001 | Cooper | 341/67 |

*Primary Examiner*—Peguy JeanPierre
(74) *Attorney, Agent, or Firm*—Wagner Murabito & Hao LLP

(57) ABSTRACT

A multiple symbol length lookup table is described. The multiple symbol length lookup table includes a plurality of lookup entries and a plurality of lookup results, each lookup entry having a corresponding lookup result. Each lookup entry comprises a particular sequence of input data bits. The input data bits are encoded with a variable length coding. Moreover, the input data bits form one or more consecutive variable length symbols. Each lookup result comprises a total length of the consecutive variable length symbols in the input data bits. In an embodiment, the multiple symbol length lookup table is generated by using a single symbol length lookup table. In practice, the input data bits are submitted to the multiple symbol length lookup table as a lookup entry. In response, the multiple symbol length lookup table returns a lookup result that is the total length or number of bits in the input data bits that a variable length decoder can decode. The total length is the length of the codes of the consecutive variable length symbols in the input data bits. Therefore, utilization of the multiple symbol length lookup table reduces the number of lookup operations that are performed on a stream of variable length encoded data and speeds up processing of the variable length encoded data, as compared to employing the single symbol length lookup table.

7 Claims, 15 Drawing Sheets

100

SINGLE SYMBOL LENGTH LOOKUP TABLE

| LOOKUP ENTRY (INPUT DATA BITS) 10 | LOOKUP RESULT (SINGLE SYMBOL LENGTH) 20 | SYMBOLS 50 |
|---|---|---|
| 000 10A | 1 20A | (0) |
| 001 10B | 1 20B | (0) |
| 010 10C | 1 20C | (0) |
| 011 10D | 1 20D | (0) |
| 100 10E | 2 20E | (10) |
| 101 10F | 2 20F | (10) |
| 110 10G | 3 20G | (110) |
| 111 10H | 3 20H | (111) |

| VARIABLE LENGTH SYMBOLS |
|---|
| 0<br>70A |
| 10<br>70B |
| 110<br>70C |
| 111<br>70D |

MULTIPLE SYMBOL LENGTH LOOKUP TABLE

| LOOKUP ENTRY (INPUT DATA BITS) 310 | LOOKUP RESULT (TOTAL SYMBOL LENGTH) 320 | SYMBOLS 350 |
|---|---|---|
| 000 310A | 3 320A | (0,0,0) |
| 001 310B | 2 320B | (0,0) |
| 010 310C | 3 320C | (0,10) |
| 011 310D | 4 320D | (0,110) OR (0,111) |
| 100 310E | 3 320E | (10,0) |
| 101 310F | 2 320F | (10) |
| 110 310G | 3 320G | (110) |
| 111 310H | 3 320H | (111) |

FIGURE 3A

MULTIPLE SYMBOL LENGTH LOOKUP TABLE

RELATED U.S. APPLICATION

This patent application is a continuation of application Ser. No. 09/707,414, filed Nov. 6, 2000, entitled "MULTIPLE SYMBOL LENGTH LOOKUP TABLE", by LUNA et al., which is hereby incorporated by reference, and which claims the benefit of U.S. Provisional Application No. 60/176,256, filed on Jan. 15, 2000, entitled "PRE-PARSING OF VARIABLE LENGTH DIGITAL VIDEO (DV) STREAMS", by Amelia C. Luna, and Jason (Naxin) Wang.

BACKGROUND OF THE INVENTION

1. Field of the Invention

The present invention generally relates to the field of variable length coding and to the field of digital video data processing. More particularly, the present invention relates to the field of lookup tables that return the length of bits that a variable length decoder can decode from a sequence of encoded data bits.

2. Related Art

Variable length coding provides an efficient technique for data compression. Many data processing fields have implemented variable length coding to compress data for numerous data applications. One type of variable length coding is known as Huffman coding. The concept of variable length coding is based on replacing data values that appear most frequently in a stream of unencoded data with shorter variable length codewords or symbols while data values that appear less frequently are replaced with longer variable length codewords or symbols. The idea being that the overall length of the stream of encoded data is smaller than the overall length of the stream of unencoded data.

Moreover, the code for any one of the variable length symbols cannot be the prefix of the code for any other variable length symbol. For example, if the code "011" is the code for a particular variable length symbol, then no other code for any other variable length symbol can begin with "011". In this way, when a variable length decoder (which recognizes the variable length symbols including the variable length symbol whose code is "011") encounters a "011" at the beginning of a stream of encoded data (e.g., 01110010 . . . ), the "011" is decoded by the variable length decoder and then decoding continues with the rest of the stream of encoded data (i.e.,"10010 . . . ").

The field of digital video data processing applies variable length coding in various applications. In particular, digital video data which is formatted as specified in a specification entitled, "The Specification of Consumer Use Digital VCR's using 6.3 mm Magnetic Tape", (HD Video Conference, December, 1994), is variable length coded as described in the specification to reduce the space required to store the digital video data. This specification is commonly known as the DV standard. The DV standard is a compressed digital video data and digital audio data recording standard. A DV digital video system uses a ¼ inch (6.35 mm) metal evaporate tape to record very high quality digital video data. Alternatively, a DV digital video system can record by transmitting to a memory device (e.g., hard drive, RAM, ROM, etc.) very high quality digital video data and digital audio data for storing therein. Both consumers and professionals use DV digital video systems.

To play the digital video data which is formatted according to the DV standard, the DV digital video system includes a DV decoder for processing the digital video data into a format which can be displayed on an electronic display device. Since the DV decoder processes the digital video data in real-time, speed and performance are crucial characteristics of the DV decoder.

A conventional DV decoder utilizes a lookup table which is similar in function to the single symbol length lookup table 100 illustrated in FIG. 1 to process a stream of digital video data. The table 200 of variable length symbols illustrated in FIG. 2 provides the set of variable length symbols 70A–70D used to variable length encode a stream of data bits (e.g., digital video data) specifically for performing a lookup operation with the single symbol length lookup table 100 of FIG. 1. A first variable length symbol 70A has the code "0". A second variable length symbol 70B has the code "10". A third variable length symbol 70C has the code "110". A fourth variable length symbol 70D has the code "111".

The single symbol length lookup table 100 includes a plurality of lookup entries 10 and a plurality of lookup results 20, whereas each lookup entry has a corresponding lookup result. For example, the lookup entry 10D returns the lookup result 20D. The column 50 shows the variable length symbol whose length is indicated by the lookup result 20.

In processing the stream of data bits (variable length encoded), the conventional DV decoder submits a number of data bits from the stream of data bits (variable length encoded) to the single symbol length lookup table 100 as a lookup entry 10A–10H. The single symbol length lookup table 100 returns a lookup result 20A–20H that is the length (in bits) of a single variable length symbol in response to a lookup entry 10A–10H having a sequence of input data bits (variable length encoded) forming one or more consecutive variable length symbols. In other words, the single symbol length lookup table 100 returns the length or number of bits (starting from the beginning of the stream of input data bits submitted as a lookup entry) which correspond to a variable length symbol that can be decoded by a variable length decoder. Hence, the conventional DV decoder can find a particular variable length symbol (e.g., a variable length symbol corresponding to an End of Block (EOB)) in the stream of digital video data (variable length encoded) by using the single symbol length lookup table 100.

For example, if a stream of data bits (variable length encoded) is "00100 . . . "(encoded using the table 200 of variable length symbols shown in FIG. 2), the first bit through the third bit are first submitted as the lookup entry value "001", which corresponds to the lookup entry 10B. Specifically, the stream "00100 . . . " has a plurality of consecutive variable length symbols which can be identified once the length of each variable length symbol is determined. In response, the single symbol length lookup table 100 returns the lookup result 20B which has the value "1", which indicates that the lookup entry value "001" has a variable length symbol and that its length is "1" bit, (i.e., the code "0"). Therefore, the stream of data bits (variable length encoded) is advanced by one bit.

Thereafter, the second bit through the fourth bit are submitted as the lookup entry value "010", which corresponds to the lookup entry 10C. In response, the single symbol length lookup table 100 returns the lookup result 20C which has the value "1", which indicates that the lookup entry value "010" has a variable length symbol and that its length is "1" bit, (i.e., the code "0"). Therefore, the stream of data bits (variable length encoded) is advanced again by one bit. Thus, the performance of two lookup operations reveals that the beginning of the stream "00100 . . . " has a first variable length symbol 70A and another first variable length symbol 70A. The processing of the stream of data bits (variable length encoded) continues in a similar manner.

Unfortunately, the single symbol length lookup table 100 slows down the processing of digital video data in a conventional DV decoder because of the great number of lookup operations performed on the stream of digital video data. This slow down caused by the single symbol length lookup table 100 limits the conventional DV decoder's ability to process the digital video data in real-time.

SUMMARY OF THE INVENTION

A multiple symbol length lookup table is described. The multiple symbol length lookup table includes a plurality of lookup entries and a plurality of lookup results, each lookup entry having a corresponding lookup result. Each lookup entry comprises a particular sequence of input data bits. The input data bits are encoded with a variable length coding. Moreover, the input data bits form one or more consecutive variable length symbols. Each lookup result comprises a total length of the consecutive variable length symbols in the input data bits. In an embodiment, the multiple symbol length lookup table is generated by using a single symbol length lookup table.

In practice, the input data bits are submitted to the multiple symbol length lookup table as a lookup entry. In response, the multiple symbol length lookup table returns a lookup result that is the total length or number of bits in the input data bits that a variable length decoder can decode. The total length is the length of the codes of the consecutive variable length symbols in the input data bits. Therefore, utilization of the multiple symbol length lookup table reduces the number of lookup operations that are performed on a stream of variable length encoded data and speeds up processing of the variable length encoded data, as compared to employing the single symbol length lookup table.

In an embodiment, a memory size of a memory device that stores the multiple symbol length lookup table is used to determine a table size of the multiple symbol length lookup table. Moreover, the table size determines an entry length for each lookup entry. A larger table size increases the speed of processing the variable length encoded data. In an embodiment, the variable length coding is a Huffman coding.

These and other advantages of the present invention will no doubt become apparent to those of ordinary skill in the art after having read the following detailed description of the preferred embodiments which are illustrated in the drawing figures.

In one embodiment, the present invention includes a method of generating a symbol length lookup table that returns a total length of one or more consecutive variable length symbols in response to a plurality of input data bits forming the one or more consecutive variable length symbols, the method comprising the steps of: a) determining a table size of the symbol length lookup table based on a memory size associated with a memory device for storing therein the symbol length lookup table; b) determining an entry length for each lookup entry of the symbol length lookup table based on the table size, wherein each lookup entry corresponds to a sequence of the plurality of input data bits; and c) determining a lookup result for each lookup entry of the symbol length lookup table by using a second symbol length lookup table that returns a single symbol length of the one or more consecutive variable length symbols in response to the plurality of input data bits forming the one or more consecutive variable length symbols, wherein the lookup result represents the total length, and wherein the table size of the symbol length lookup table is no less than a second table size of the second symbol length lookup table.

In another embodiment, the present invention includes a method of generating a symbol length lookup table that returns a total length of one or more consecutive variable length symbols in response to a plurality of input data bits forming the one or more consecutive variable length symbols, the method comprising the steps of: a) forming a first data set based on a longest symbol length returned by a second symbol length lookup table that returns a single symbol length of the one or more consecutive variable length symbols in response to the plurality of input data bits forming the one or more consecutive variable length symbols; b) forming a second data set by concatenating a lookup entry of the symbol length lookup table with each first data of the first data set, wherein the lookup entry corresponds to a sequence of the plurality of input data bits; c) using the second symbol length lookup table to find a symbol boundary of each variable length symbol of each second data of the second data set, wherein each second data includes a first bit and a last bit; d) determining a length between the first data bit and a last common symbol boundary, wherein the length represents the total length and represents a lookup result corresponding to the lookup entry of the symbol length lookup table; and e) repeating the steps b) to d) for each lookup entry of the symbol length lookup table.

BRIEF DESCRIPTION OF THE DRAWINGS

The accompanying drawings, which are incorporated in and form a part of this specification, illustrate embodiments of the invention and, together with the description, serve to explain the principles of the present invention.

FIG. 1 illustrates a single symbol length lookup table of the prior art.

FIG. 2 illustrates an exemplary table of variable length symbols.

FIG. 3A illustrates a multiple symbol length lookup table according to an embodiment of the present invention.

Figure 3B:
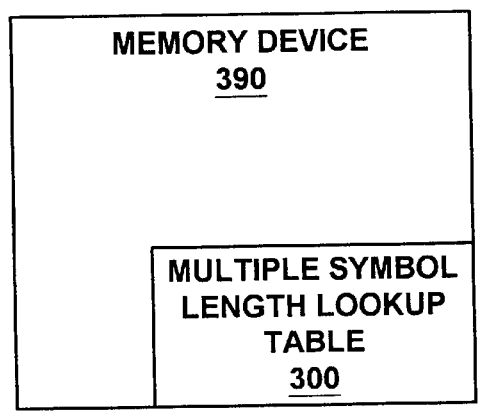
FIG. 3B illustrates a memory device according to an embodiment of the present invention, showing stored therein the multiple symbol length lookup table of FIG. 3A.

The drawings referred to in this description should not be understood as being drawn to scale except if specifically noted.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Notation and Nomenclature

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proved convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "determining", "generating", "using", "forming", "concatenating", or the like, refer to the actions and processes of an electronic system or a computer system. The computer system or similar electronic computing device manipulates and transforms data represented as physical (electronic) quantities within the computer system's registers and memories into other data similarly represented as physical quantities within the computer system memories or registers or other information storage, transmission, or display devices.

Multiple Symbol Length Lookup Table

FIG. 3A illustrates a multiple symbol length lookup table 300 according to an embodiment of the present invention. The multiple symbol length lookup table 300 includes a plurality of lookup entries 310 and a plurality of lookup results 320, each lookup entry has a corresponding lookup result. For example, the lookup entry 310E corresponds with the lookup result 320E. The multiple symbol length lookup table 300 is implemented to recognize the codes of the variable length symbols 70A–70D of the exemplary table 200 of FIG. 2. It should be understood that the multiple symbol length lookup table 300 can be implemented to recognize variable length symbols having any other codes.

Each lookup entry 310A–310H comprises a possible sequence of input data bits which are selected from a stream of data, whereas the stream of data is encoded with a variable length coding. Thus, the stream of data comprises a plurality of variable length codewords or symbols. The variable length symbols appear in a consecutive manner within the stream of data. In an embodiment, the variable length coding is a Huffman coding, and the variable length symbols are Huffman coding symbols. It should be understood that the variable length coding can be any type of variable length coding.

In an embodiment, the stream of data comprises digital video data. In an embodiment, the digital video data is formatted as specified in a specification entitled, "The Specification of Consumer Use Digital VCR's using 6.3 mm Magnetic Tape", (HD Video Conference, December, 1994), commonly known as the DV standard. It should be understood that the multiple symbol length lookup table 300 of the present invention can be practiced with digital video data which is formatted in accordance with other standards, such as standards developed by the Moving Picture Experts Group (MPEG) (e.g., MPEG-1, MPEG-2, MPEG-3, etc.). It should be understood that the multiple symbol length lookup table 300 of the present invention can be practiced with other types of data.

The multiple symbol length lookup table 300 of FIG. 3A is applied on the stream of data which has a plurality of variable length symbols that are based on a binary format. It should be understood that the present invention can be applied to variable length symbols based on an alphabet format, a decimal formal, or any other format.

As an example, if the stream of data is variable length encoded using a first variable length symbol 70A of table 200 having the code "0", another first variable length symbol 70A of table 200 having the code "0", another first variable length symbol 70A of table 200 having the code "0", and a second variable length symbol 70B of table 200 having the code "10", the stream of data becomes the stream "00010". Since the length of each individual variable length symbol can be different, it is difficult to identify each variable length symbol in the stream of data without using the multiple symbol length lookup table 300.

Each lookup result 320A–320H comprises a total length or number of bits that a variable length decoder can decode from the lookup entry value, whereas the lookup entry value is selected from the stream of data (variable length encoded). The total length is the total length of the codes of consecutive variable length symbols formed by the sequence of input data bits (or lookup entry) selected from the stream of data (variable length encoded). For example, the lookup entry 310C (i.e., "010") has a corresponding lookup result 320C which has the value "3", indicating that the lookup entry 310C (i.e., "010") has three consecutive bits (starting from the beginning of the lookup entry value) corresponding to one or more consecutive variable length symbols than can be decoded by a variable length decoder.

The column 350 shows the one or more consecutive variable length symbols whose length is indicated by the lookup result 320. For example, the lookup result 320A indicates the lookup entry 310A (i.e., "000") has one or more consecutive variable length variables that have a total length of three bits, which corresponds to one bit for the code of a first variable length symbol "0", one bit for the code of another first variable length symbol "0", and one bit for the code of yet another first variable length symbol "0", as indicated in column 350 by (0,0,0) placed next to the lookup result 320A.

In practice, a number of input data bits are selected from the stream of data (variable length encoded). The input data bits are submitted to the multiple symbol length lookup table 300 as a lookup entry. In response to the lookup entry, the multiple symbol length lookup table 300 returns a lookup result that is the total length or number of bits in the input data bits that a variable length decoder can decode. Therefore, the stream of data (variable length encoded) can be advanced by the value of the lookup result. More importantly, utilization of the multiple symbol length lookup table 300 reduces the number of lookup operations that are performed on a stream of data (variable length encoded) and speeds up processing of the stream of data (variable length encoded), as compared to employing the single symbol length lookup table 100 of FIG. 1.

Repeating the example discussed in connection with the single symbol length lookup table 100 but substituting the multiple symbol length lookup table 300, if a stream of data (variable length encoded) is "00100 . . . " (encoded using the table 200 of variable length symbols shown in FIG. 2), the first bit through the third bit are first submitted as the lookup entry value "001" to the multiple symbol length lookup table 300, which corresponds to the lookup entry 310B. In response to the lookup entry 310B, the multiple symbol length lookup table 300 returns the lookup result 320B which has the value "2", which indicates that the lookup entry value "001" has one or more consecutive variable length symbols and that their total length is "2" bits, (i.e., the code "0" and the code "0"). Therefore, the stream of data (variable length encoded) is advanced by two bits.

Thereafter, the third bit through the fifth bit are submitted as the lookup entry value "100", which corresponds to the lookup entry 310E. In response to the lookup entry 310E, the multiple symbol length lookup table 300 returns the lookup result 320E which has the value "3", which indicates that the lookup entry value "100" has one or more consecutive variable length symbols and that their total length is "3" bits, (i.e., the code "10" and the code "0"). Therefore, the stream of data (variable length encoded) is advanced by three bits. Thus, the performance of two lookup operations reveals that the beginning of the stream "00100 . . . " has five bits corresponding to consecutive variable length symbols. The processing of the stream of data (variable length encoded) can continue in a similar manner.

This example illustrates the advantage and benefits of the multiple symbol length lookup table 300, showing that while two lookup operations performed with the single symbol length lookup table 100 processed only two bits of the stream "00100 . . . ", two lookup operations performed with the multiple symbol length lookup table 300 processed five bits of the stream "00100 . . . ". In particular, it only required one lookup operation with the multiple symbol length lookup table 300 to realize that the first and second bits of the stream "00100 . . . " were codes for one or more consecutive variable length symbols which could be decoded by the variable length decoder. On the other hand, it required two lookup operations with the single symbol length lookup table 100 to realize that the first and second bits of the stream "00100 . . . " were codes for one or more consecutive variable length symbols which could be decoded by the variable length decoder. Specifically, when the lookup entry has numerous codes of short variable length symbols, the multiple symbol length lookup table 300 provides marked improvements in the speed in which the stream of data (variable length encoded) is processed (e.g., by a DV decoder).

For instance, the column 350 indicates that the lookup entries 310A–310E of the multiple symbol length lookup table 300 have one or more short variable length symbols of code "0". Thus, the lookup entries 310A–310E have lookup results 320A–320E that have larger values than the corresponding lookup entries 10A–10E and the lookup results 20A–20E of the single symbol length lookup table 100. Moreover, the distinctive characteristic of a stream of data which is variable length encoded is the presence of a larger number of short variable length symbols than long variable length symbols, enabling the multiple symbol length lookup table 300 of the present invention to outperform the single symbol length lookup table 100.

It should be understood that the multiple symbol length lookup table 300 can be implemented in many other configurations, as will be discussed below.

In an embodiment, the multiple symbol length lookup table 300 is used by a DV decoder to search for a variable length symbol corresponding to an End of Block (EOB) in a stream of digital video data prior to moving the stream of digital video data to a variable length decoder. In this embodiment, the multiple symbol length lookup table 300 has a dedicated lookup entry for handling the variable length symbol corresponding to an End of Block (EOB). In particular, the DV decoder includes a preparser unit that utilizes the multiple symbol length lookup table 300 of the present invention in performing several operations that recover a decoding order of the stream of digital video data so that the variable length decoder can decode the variable length format of the stream of digital video data. The DV decoder is disclosed in the co-pending patent application "IMPLEMENTATION OF A DV VIDEO DECODER WITH A VLIW PROCESSOR AND A VARIABLE LENGTH DECODING UNIT" (Ser. No. 09/707,521, filed on Nov. 6, 2000 by Amelia C. Luna and Jason (Naxin) Wang, assigned to the assignee of the present patent application), which is incorporated herein by reference.

FIG. 3B illustrates a memory device 390 according to an embodiment of the present invention, showing stored therein the multiple symbol length lookup table 300 of FIG. 3A. In an embodiment, the multiple symbol length lookup table 300 is stored in a memory device 390. The memory device 390 can be a RAM (e.g., SRAM, DRAM, SDRAM, etc.), a ROM, a flash memory, an optical memory, or any other type of memory device.

As illustrated in FIG. 3B, the multiple symbol length lookup table 300 of the present invention occupies a portion of the memory space of the memory device 390. It should be understood that the multiple symbol length lookup table 300 can be implemented to occupy any amount of memory space of the memory device 390. The memory device 390 has a memory size. As will be discussed below, the memory size is utilized to determine a table size of the multiple symbol length lookup table 300 of the present invention. A larger table size increases the speed of processing the stream of data (variable length encoded) with the multiple symbol length lookup table 300 because an entry length of the lookup entry can be increased to process a larger number of bits of the stream of data (variable length encoded) per lookup operation. In an embodiment, the table size determines an entry length for each lookup entry of the multiple symbol length lookup table 300 of the present invention.

Figure 4:
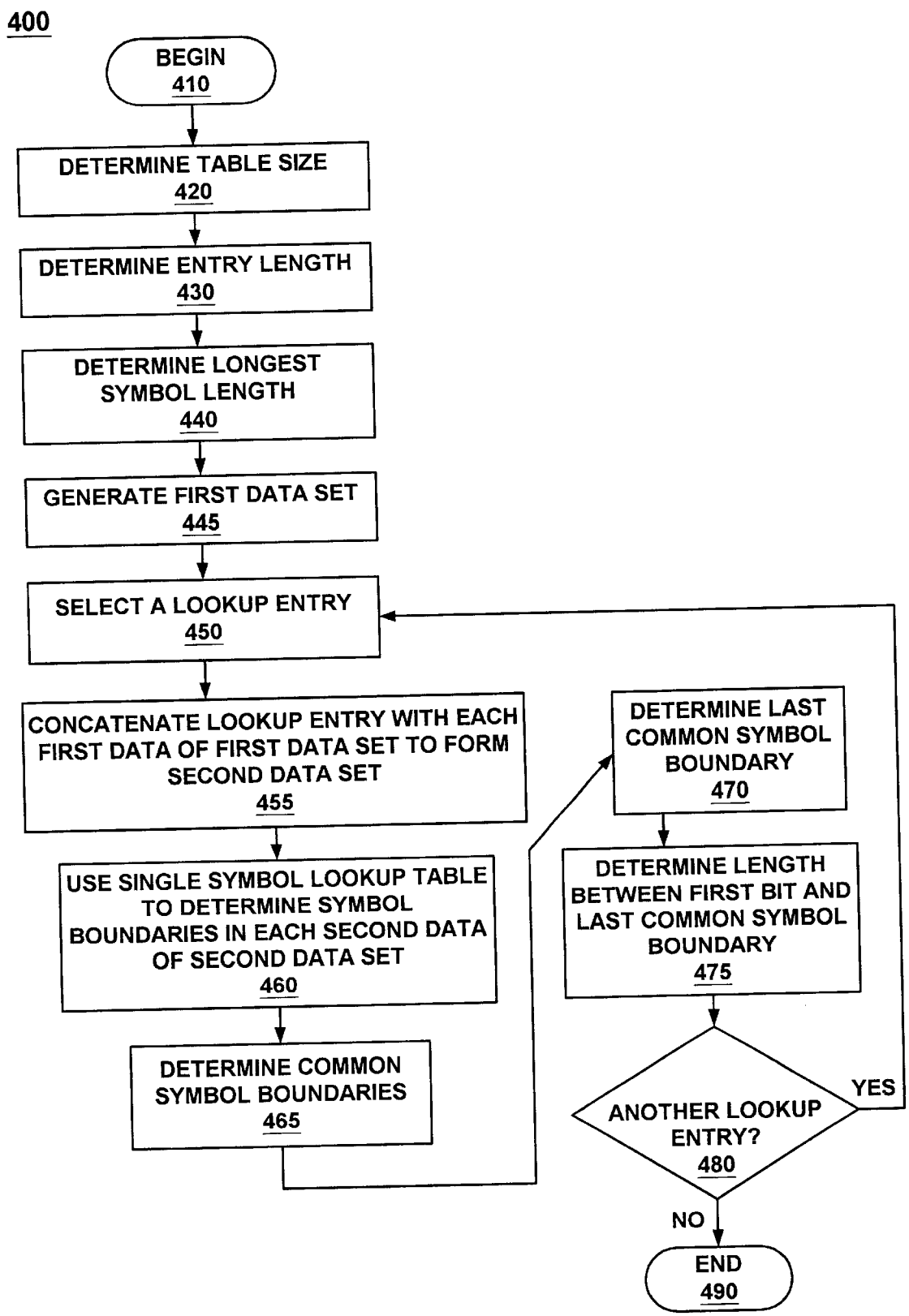
FIG. 4 is a flow chart, illustrating a method of generating a multiple symbol length lookup table in accordance with an embodiment of the present invention.

FIG. 4 is a flow chart, illustrating a method 400 of generating a multiple symbol length lookup table in accordance with an embodiment of the present invention. The single symbol length lookup table 100 of FIG. 1 is utilized to generate the multiple symbol length lookup table 300 of FIG. 3A. It should be understood that a different single symbol length lookup table is used for variable length symbols having other codes. In an embodiment, the method 400 of FIG. 4 is implemented as a software program stored in a computer-readable medium (e.g., a hard drive, a processor, a cache, a RAM memory, a ROM memory, a flash memory, an optical memory, etc.). It should be understood that the method 400 of FIG. 4 can be implemented in any other appropriate manner.

At step 410, the method 400 of generating a multiple symbol length lookup table in accordance with an embodiment of the present invention begins.

At step 420, the table size of the multiple symbol length lookup table is determined. The table size is based on the memory size (in bits or bytes) of the memory device 390 (see FIG. 3B) where the multiple symbol length lookup table will be stored. A large table size enables faster processing of the stream of data (variable length encoded) by reducing the number of lookup operations required to process the stream of data (variable length encoded), when compared to a smaller table size for the multiple symbol length lookup table. In an embodiment, the table size of the multiple symbol length lookup table is no less than a table size of the single symbol length lookup table which is utilized to generate the multiple symbol length lookup table. For example, the table size of the multiple symbol length lookup table can be greater than a table size of the single symbol length lookup table. Additionally, the table size of the multiple symbol length lookup table can be equal to a table size of the single symbol length lookup table.

At step 430, the entry length (in bits) for each lookup entry of the multiple symbol length lookup table is determined. To ensure that the multiple symbol length lookup table can perform a lookup operation on any combination of data within the stream of data having the variable length symbols, the table size and the entry length are related by the formula:

$$2^{entry\ length} = \text{table size},$$

if the variable length symbols are based on a binary format. Similarly, if the variable length symbols are based on an alphabet format, the table size and the entry length are related by the formula:

$$26^{entry\ length} = \text{table size}.$$

Moreover, if the variable length symbols are based on a decimal format, the table size and the entry length are related by the formula:

$$10^{entry\ length} = \text{table size}.$$

The entry length is based on the table size of the multiple symbol length lookup table. Here, since the variable length symbols are based on a binary format, the formula:

$$2^{entry\ length} = \text{table size},$$

is used to calculate the entry length. Once the entry length is determined, each lookup entry of the multiple symbol length lookup table can be determined to form a set of lookup entries. Here, each lookup entry comprises one of the unique binary representations that can be formed with a number of bits, whereas the number of bits corresponds to the entry length. In an embodiment, the entry length is equal to or longer than the longest symbol length (which is returned as a lookup result by the single symbol length lookup table) that is determined in step 440.

For the multiple symbol length lookup table 300 of FIG. 3A, the entry length was determined to be three bits. It should be understood that the entry length can be any other whole number. Thus, a set of lookup entries for the multiple symbol length lookup table 300 is {000, 001, 010, 011, 100, 101, 110, 111}, determined by generating the different possible binary representations using three bits(which is the entry length).

At step 440, the longest symbol length (in bits) returned as a lookup result by the single symbol length lookup table is determined. For example, the lookup results 20G and 20H of the single symbol length lookup table 100 (see FIG. 1) have values corresponding to the longest symbol length which is "3". It should be understood that the longest symbol length can be any other length.

At step 445, a first data set is generated based on the longest symbol length. Since the variable length symbols are based on a binary format, each first data (of the first data set) comprises one of the unique binary representations that can be formed with a number of bits, whereas the number of bits corresponds to the longest symbol length. If the longest symbol length is 3 bits, the first data set is {000, 001, 010, 011, 100, 101, 110, 111} for generating the multiple symbol length lookup table 300 of FIG. 3A.

It should be understood that if the variable length symbols are based on an alphabet format, each first data (of the first data set) comprises one of the unique alphabet representations that can be formed with a number of bits, whereas the number of bits corresponds to the longest symbol length. It should be understood that if the variable length symbols are based on a decimal format, each first data (of the first data set) comprises one of the unique alphabet representations that can be formed with a number of bits, whereas the number of bits corresponds to the longest symbol length.

At step 450, one of the lookup entries from the set of lookup entries (discussed above in step 430) is selected. For example, the lookup entry "000" is selected from the set of lookup entries (e.g., 000, 001, 010, 011, 100, 101, 110, 111) for the multiple symbol length lookup table 300 of FIG. 3A.

At step 455, the selected lookup entry is concatenated with each first data of the first data set, forming a second data set. Each second data (of the second data set) comprises the selected lookup entry and one of the first data of the first data set. Each second data has the same length or number of bits. Each second data has a first bit and a last bit.

Figure 5A:
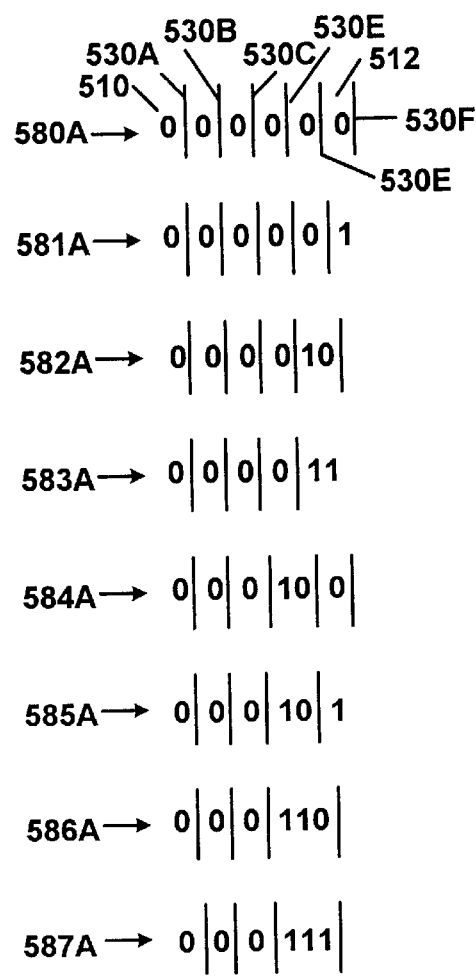
FIGS. 5A–5H illustrate the method of determining each lookup result for each lookup entry in accordance with an embodiment of the present invention.

For example, FIG. 5A illustrates the second data set formed by concatenating the lookup entry "000" with each first data of the first data set (e.g., 000, 001, 010, 011, 100, 101, 110, 111). The second data 580A comprises the lookup entry "000" and the first data "000". The second data 581A comprises the lookup entry "000" and the first data "001". The second data 582A comprises the lookup entry "000" and the first data "010". The second data 583A comprises the lookup entry "000", and the first data "011". The second data 584A comprises the lookup entry "000" and the first data "100". The second data 585A comprises the lookup entry "000" and the first data "101". The second data 586A comprises the lookup entry "000" and the first data "110". The second data 587A comprises the lookup entry "000" and the first data "111". In addition, the label 510 indicates the first bit of each second data while the label 512 indicates the last bit of each second data.

At step 460, the symbol boundaries of each variable length symbol in each second data (or the second data set) is determined using the single symbol length lookup table. For example, in FIG. 5A the symbol boundaries 530A–530F of the second data 580A were determined using the single symbol length lookup table 100 of FIG. 1, such as by performing a lookup operation and advancing the second data 580A by the lookup result as discussed above.

At step 465, the common symbol boundaries are determined for the second data set, whereas the common symbol boundary is a symbol boundary that is common to each of the second data. For example, in FIG. 5A the symbol boundaries 530A, 530B, 530C are common symbol boundaries.

At step 470, the last common symbol boundary is determined, whereas the last common symbol boundary represents a common symbol boundary which is furthest from the first bit and which is closest to the last bit of each second data of the second data set. For example, in FIG. 5A the symbol boundary 530C is last common symbol boundary for the second data set.

At step 475, the length (in bits) between the first bit and the last common symbol boundary is determined. This length represents the total length for the lookup result which corresponds to the selected lookup entry. For example, in FIG. 5A the length between the first bit 510 and the last common symbol boundary 530C is "3" bits. Hence, the lookup entry "000" has the lookup result "3", as shown in the multiple symbol length lookup table 300 of FIG. 3A.

Thereafter, the method of generating the multiple symbol length lookup table of the present invention proceeds to step 480. If another lookup entry can be selected from the set of lookup entries, the method proceeds to step 450. Otherwise, the method proceeds to step 490 and ends.

Figure 5B:
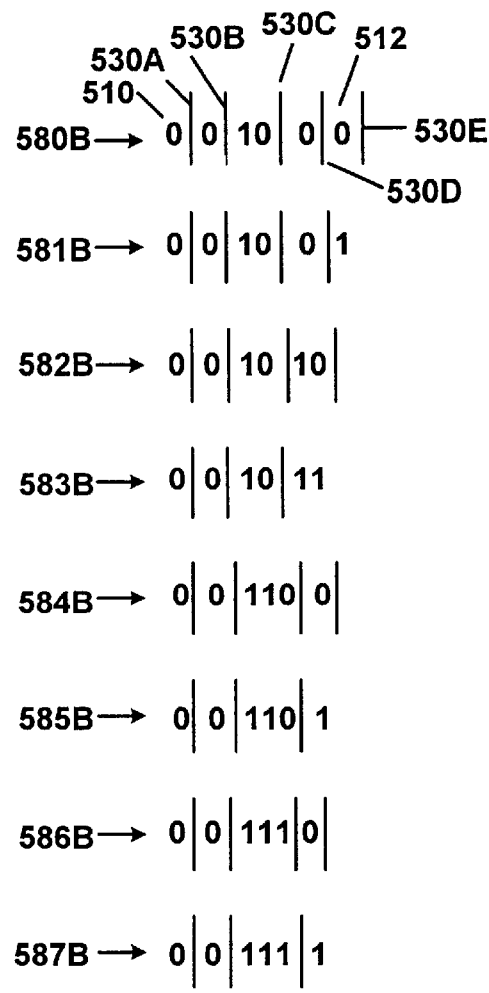

FIG. 5B illustrates the second data set generated by concatenating the lookup entry "001" with each first data of the first data set (e.g., 000, 001, 010, 011, 100, 101, 110, 111), showing step 455 through step 475 (FIG. 4) for the lookup entry "001". The second data 580B comprises the lookup entry "001" and the first data "000". The second data 581B comprises the lookup entry "001" and the first data "001". The second data 582B comprises the lookup entry "001" and the first data "010". The second data 583B comprises the lookup entry "001" and the first data "011". The second data 584B comprises the lookup entry "001" and the first data "100". The second data 585B comprises the lookup entry "001" and the first data "101". The second data 586B comprises the lookup entry "001" and the first data "110". The second data 587B comprises the lookup entry "001" and the first data "111". In addition, the label 510 indicates the first bit of each second data while the label 512 indicates the last bit of each second data. Moreover, the symbol boundaries 530A–530E of the second data 580B were determined using the single symbol length lookup table 100 of FIG. 1. Specifically, the symbol boundary 530B is the last common symbol boundary. The length between the first bit 510 and the last common symbol boundary 530B is "2" bits. Hence, the lookup entry "001" has the lookup result "3", as shown in the multiple symbol length lookup table 300 of FIG. 3A.

Figure 5C:
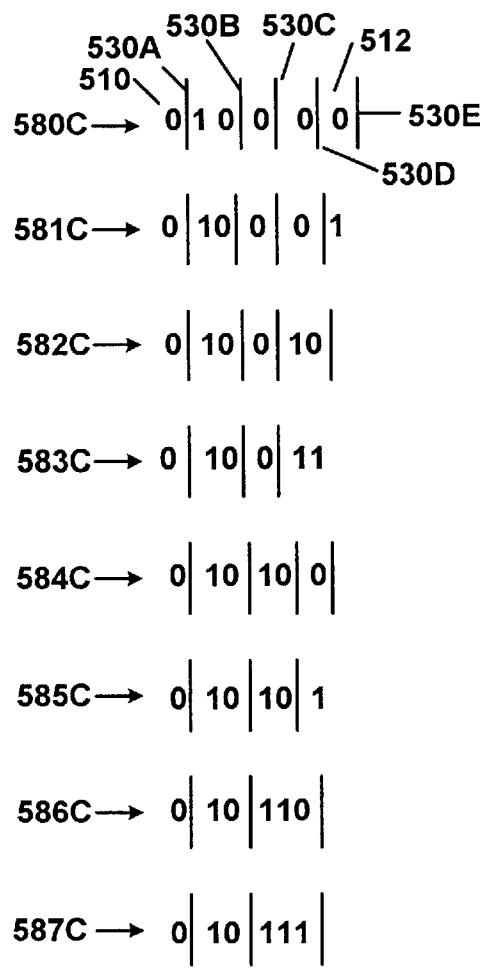

FIG. 5C illustrates the second data set generated by concatenating the lookup entry "010" with each first data of the first data set (e.g., 000, 001, 010, 011, 100, 101, 110, 111), showing step 455 through step 475 (FIG. 4) for the lookup entry "010". In addition, the label 510 indicates the first bit of each second data while the label 512 indicates the last bit of each second data. Moreover, the symbol boundaries 530A–530E of the second data 580C were determined using the single symbol length lookup table 100 of FIG. 1. Specifically, the symbol boundary 530B is the last common symbol boundary. The length between the first bit 510 and the last common symbol boundary 530B is "3" bits. Hence, the lookup entry "010" has the lookup result "3", as shown in the multiple symbol length lookup table 300 of FIG. 3A.

Figure 5D:
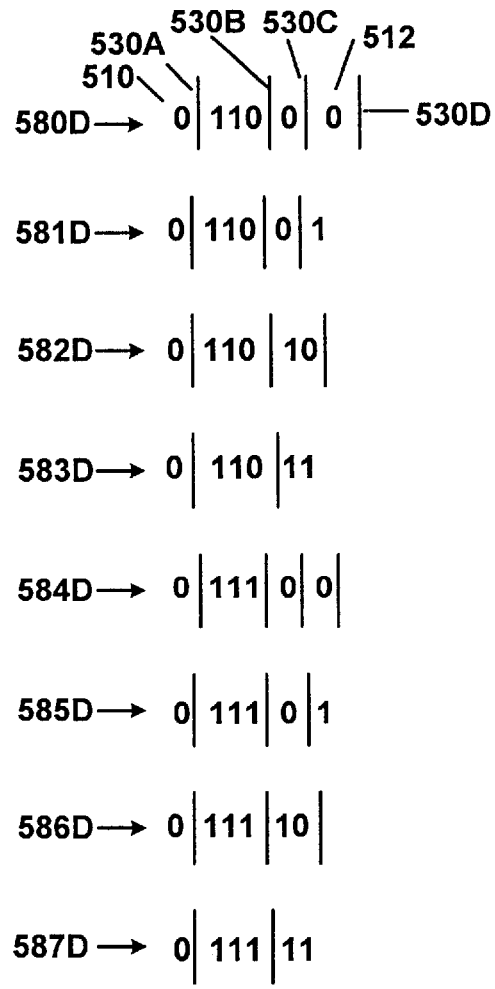

FIG. 5D illustrates the second data set generated by concatenating the lookup entry "011" with each first data of the first data set (e.g., 000, 001, 010, 011, 100, 101, 110, 111), showing step 455 through step 475 (FIG. 4) for the lookup entry "011". In addition, the label 510 indicates the first bit of each second data while the label 512 indicates the last bit of each second data. Moreover, the symbol boundaries 530A–530D of the second data 580D were determined using the single symbol length lookup table 100 of FIG. 1. Specifically, the symbol boundary 530B is the last common symbol boundary. The length between the first bit 510 and the last common symbol boundary 530B is "4" bits. Hence, the lookup entry "011" has the lookup result "4", as shown in the multiple symbol length lookup table 300 of FIG. 3A. The lookup result is "4" because the multiple symbol length lookup table of FIG. 3A predicts that another variable length symbol will be formed, whether the next bit of the stream of data is "0" or "1".

Figure 5E:
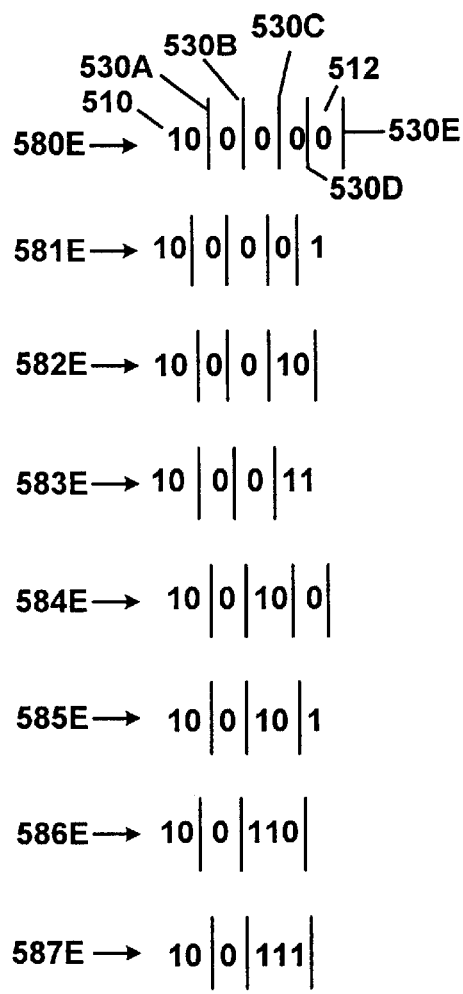

FIG. 5E illustrates the second data set generated by concatenating the lookup entry "100" with each first data of the first data set (e.g., 000, 001, 010, 011, 100, 101, 110, 111), showing step 455 through step 475 (FIG. 4) for the lookup entry "100". In addition, the label 510 indicates the first bit of each second data while the label 512 indicates the last bit of each second data. Moreover, the symbol boundaries 530A–530E of the second data 580E were determined using the single symbol length lookup table 100 of FIG. 1. Specifically, the symbol boundary 530B is the last common symbol boundary. The length between the first bit 510 and the last common symbol boundary 530B is "3" bits. Hence, the lookup entry "100" has the lookup result "3", as shown in the multiple symbol length lookup table 300 of FIG. 3A.

Figure 5F:
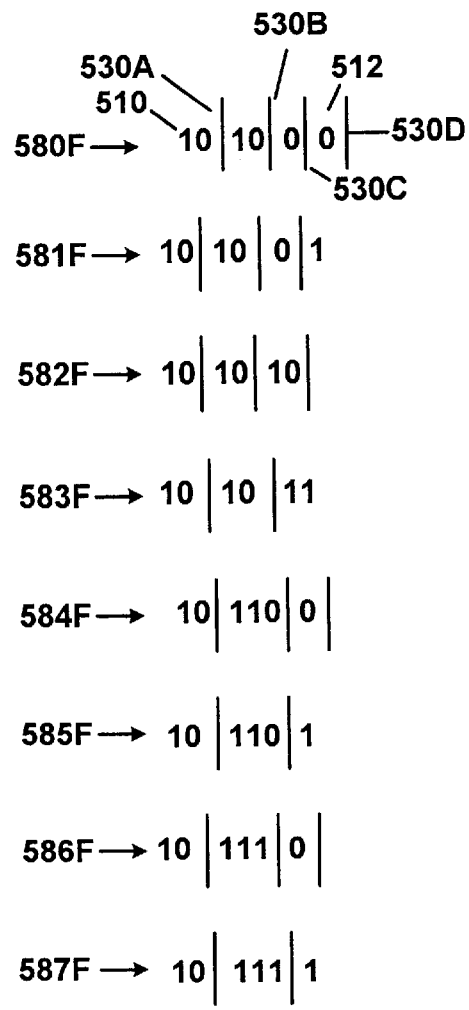

FIG. 5F illustrates the second data set generated by concatenating the lookup entry "101" with each first data of the first data set (e.g., 000, 001, 010, 011, 100, 101, 110, 111), showing step 455 through step 475 (FIG. 4) for the lookup entry "101". In addition, the label 510 indicates the first bit of each second data while the label 512 indicates the last bit of each second data. Moreover, the symbol boundaries 530A–530D of the second data 580F were determined using the single symbol length lookup table 100 of FIG. 1. Specifically, the symbol boundary 530A is the last common symbol boundary. The length between the first bit 510 and the last common symbol boundary 530B is "2" bits. Hence, the lookup entry "101" has the lookup result "2", as shown in the multiple symbol length lookup table 300 of FIG. 3A.

Figure 5G:
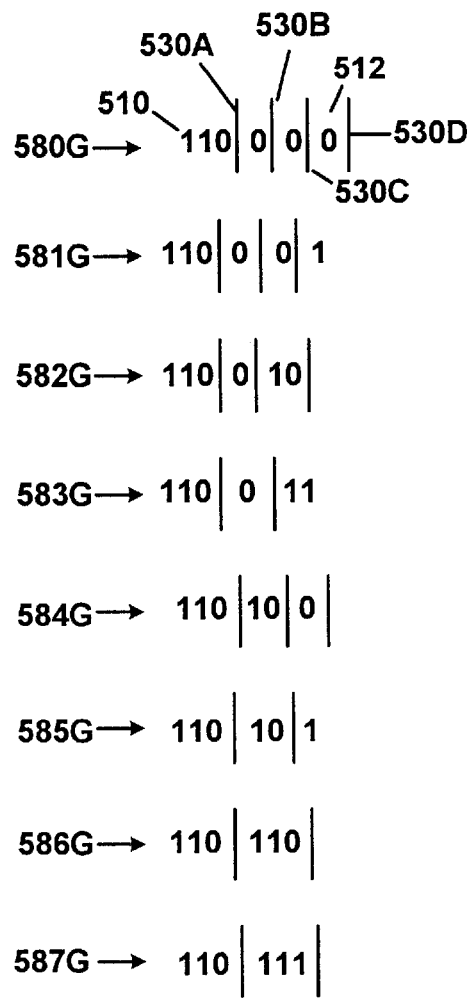

FIG. 5G illustrates the second data set generated by concatenating the lookup entry "110" with each first data of the first data set (e.g., 000, 001, 010, 011, 100, 101, 110, 111), showing step 455 through step 475 (FIG. 4) for the lookup entry "110". In addition, the label 510 indicates the first bit of each second data while the label 512. indicates the last bit of each second data. Moreover, the symbol boundaries 530A–530D of the second data 580G were determined using the single symbol length lookup table 100 of FIG. 1. Specifically, the symbol boundary 530A is the last common symbol boundary. The length between the first bit 510 and the last common symbol boundary 530B is "3" bits. Hence, the lookup entry "110" has the lookup result "3", as shown in the multiple symbol length lookup table 300 of FIG. 3A.

Figure 5H:
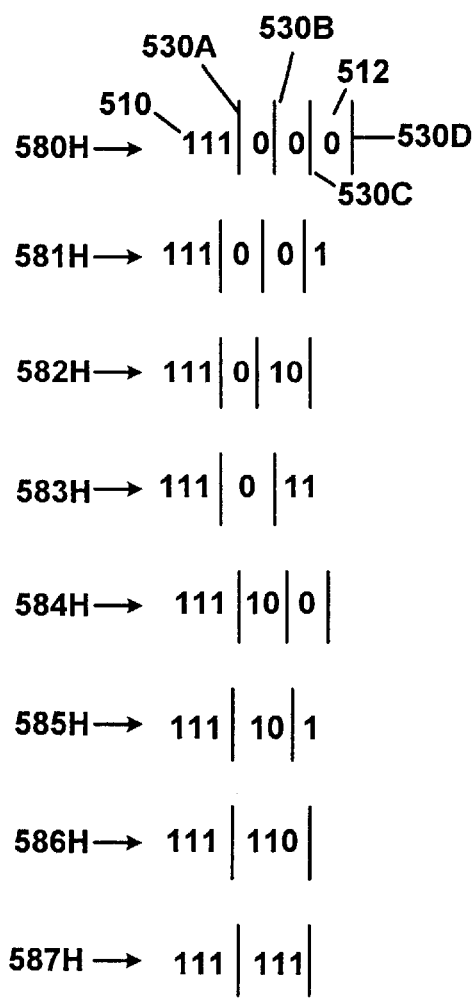

FIG. 5H illustrates the second data set generated by concatenating the lookup entry "111" with each first data of the first data set (e.g., 000, 001, 010, 011, 100, 101, 110,111), showing step 455 through step 475 (FIG. 4) for the lookup entry "111". In addition, the label 510 indicates the first bit of each second data while the label 512 indicates the last bit of each second data. Moreover, the symbol boundaries 530A–530D of the second data 580H were determined using the single symbol length lookup table 100 of FIG. 1. Specifically, the symbol boundary 530A is the last common symbol boundary. The length between the first bit 510 and the last common symbol boundary 530B is "3" bits. Hence, the lookup entry "111" has the lookup result "3", as shown in the multiple symbol length lookup table 300 of FIG. 3A.

Figure 6A:
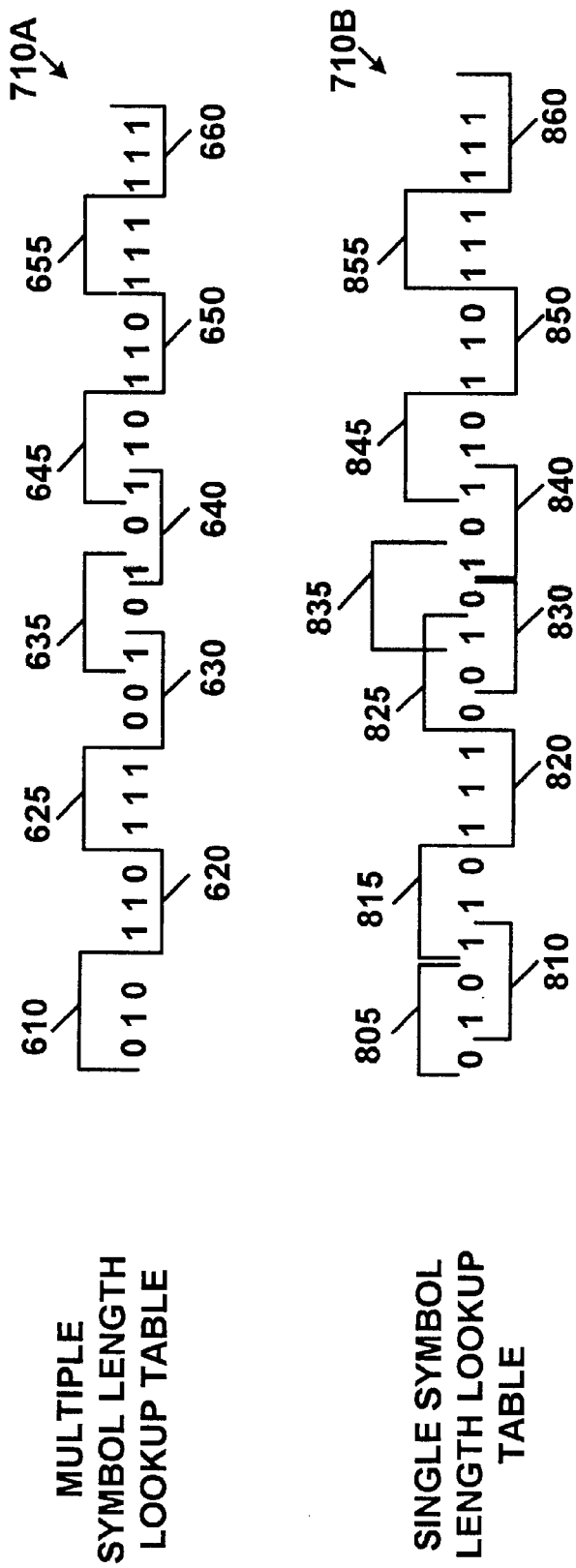
FIG. 6A illustrates a plurality of lookup operations performed on a first stream of data with a multiple symbol length lookup table of the present invention and with a single symbol length lookup table of the prior art.

FIG. 6A illustrates a plurality of lookup operations performed on a first stream of data (variable length encoded with the variable length symbols of table 200 of FIG. 2) with a multiple symbol length lookup table of the present invention and on the first stream of data with a single symbol length lookup table of the prior art. The first, second, and third bits of the stream of data 710A are submitted as a lookup entry 610 (i.e., "010") to the multiple symbol length lookup table 300 of FIG. 3A. The multiple symbol length lookup table 300 returns the lookup result "3". The stream of data 710A is advanced by three bits. The fourth through the sixth bits of the stream of data 710A are submitted as a lookup entry 620 (i.e., "110") to the multiple symbol length lookup table 300 of FIG. 3A. The multiple symbol length lookup table 300 returns the lookup result "3". The processing of the stream of data 710A continues in a similar manner, whereas ten lookup operations 610–660 are performed by the multiple symbol length lookup table 300.

Similarly, the first, second, and third bits of the stream of data 710B are submitted as a lookup entry 805 (i.e., "010") to the single symbol length lookup table 100 of FIG. 1, whereas the stream of data 710B is the same as the stream of data 710A. The single symbol length lookup table 100 returns the lookup result "1". The stream of data 710B is advanced by one bit. The second through the fourth bits of the stream of data 710B are submitted as a lookup entry 810 (i.e., "101") to the single symbol length lookup table 100 of FIG. 1. The single symbol length lookup table 100 returns the lookup result "2". The processing of the stream of data 710B continues in a similar manner, whereas twelve lookup operations 805–860 are performed by the single symbol length lookup table 100. FIG. 6A shows that the multiple symbol length lookup table 300 reduces the number of lookup operations required to process a stream of data (variable length encoded).

Figure 6B:
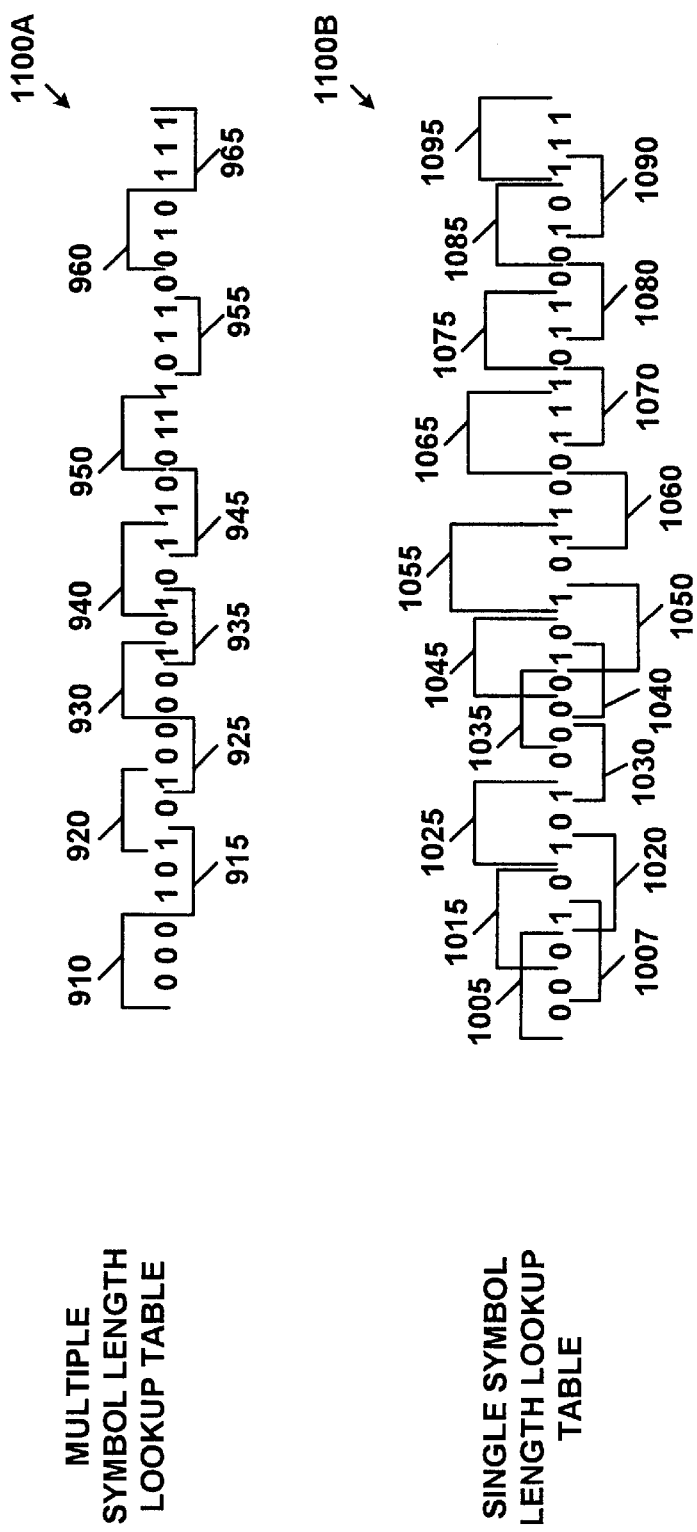
FIG. 6B illustrates a plurality of lookup operations performed on a second stream of data with a multiple symbol length lookup table of the present invention and with a single symbol length lookup table of the prior art.

FIG. 6B illustrates a plurality of lookup operations performed on a second stream of data (variable length encoded with the variable length symbols of table 200 of FIG. 2) with a multiple symbol length lookup table of the present invention and on the second stream of data with a single symbol length lookup table of the prior art. The first, second, and third bits of the stream of data 1100A are submitted as a lookup entry 910 (i.e., "000") to the multiple symbol length lookup table 300 of FIG. 3A. The multiple symbol length lookup table 300 returns the lookup result "3". The stream of data 1100A is advanced by three bits. The fourth through the sixth bits of the stream of data 1100A are submitted as a lookup entry 915 (i.e., "101") to the multiple symbol length lookup table 300 of FIG. 3A. The multiple symbol length lookup table 300 returns the lookup result "2" The processing of the stream of data 1100A continues in a similar manner, whereas twelve lookup operations 910–965 are performed by the multiple symbol length lookup table 300.

Similarly, the first, second, and third bits of the stream of data 1100B are submitted as a lookup entry 1005 (i.e., "000") to the single symbol length lookup table 100 of FIG. 1, whereas the stream of data 1100B is the same as the stream of data 11m00AThe singlesymbollength lookup table returns the lookup result. The te stream of data 1100B is advanced by one bit. The second through the fourth bits of the stream of data 1000B are submitted as a lookup entry 1007 (i.e., "001") to the single symbol length lookup table 100 of FIG. 1. The single symbol length lookup table 100 returns the lookup result "1". The processing of the stream of data 1100B continues in a similar manner, whereas nineteen lookup operations 1005–1095 are performed by the single symbol length lookup table 100. FIG. 6B shows that the multiple symbol length lookup table 300 reduces the number of lookup operations required to process a stream of data (variable length encoded).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A memory device having a memory size and comprising:

a symbol length lookup table stored therein, wherein said symbol length lookup table returns a total length of one or more consecutive variable length symbols in response to a plurality of input data bits forming said one or more consecutive variable length symbols, wherein said symbol length lookup table has a table size which is based on said memory size.

2. A memory device as recited in claim 1 wherein said symbol length lookup table has a plurality of lookup entries, wherein each lookup entry has an entry length which is based on said table size, and wherein each lookup entry corresponds to a sequence of said plurality of input data bits.

3. A memory device as recited in claim 2 wherein said one or more consecutive variable length symbols are based on a binary format, and wherein said entry length for each lookup entry is determined by using said table size and a formula as follows:

$$2^x = b,$$

wherein b is said table size, and wherein x is said entry length.

4. A memory device as recited in claim 2 wherein said one or more consecutive variable length symbols are based on an alphabet format, and wherein said entry length for each lookup entry is determined by using said table size and a formula as follows:

$$26^x = b,$$

wherein b is said table size, and wherein x is said entry length.

5. A memory device as recited in claim 2 wherein said one or more consecutive variable length symbols are based on a decimal format, and wherein said entry length for each lookup entry is determined by using said table size and a formula as follows:

$$10^x = b,$$

wherein b is said table size, and wherein x is said entry length.

6. A memory device as recited in claim 1 wherein said plurality of input data bits comprises DV (Digital Video) formatted data.

7. A memory device as recited in claim 1 wherein said one or more consecutive variable length symbols comprise Huffman coding symbols.

* * * * *